United States Patent
Chen et al.

(10) Patent No.: US 10,948,517 B2
(45) Date of Patent: *Mar. 16, 2021

(54) TEST DEVICE AND METHOD

(71) Applicant: Delta Electronics, Inc., Taoyuan (TW)

(72) Inventors: Tien-He Chen, Taoyuan (TW);
Shou-Chieh Lin, Taoyuan (TW);
Che-Min Chen, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/448,619

(22) Filed: Jun. 21, 2019

(65) Prior Publication Data

US 2019/0310286 A1 Oct. 10, 2019

Related U.S. Application Data

(62) Division of application No. 15/373,796, filed on Dec. 9, 2016, now Pat. No. 10,656,176.

(30) Foreign Application Priority Data

Jun. 22, 2016 (TW) .................................. 105119517

(51) Int. Cl.
*G01R 1/04* (2006.01)
*G06F 11/30* (2006.01)

(52) U.S. Cl.
CPC ........ *G01R 1/0416* (2013.01); *G06F 11/3027* (2013.01)

(58) Field of Classification Search
CPC .............. G01R 31/31924; G01R 31/26; G01R 31/2642; G01R 31/2648; G01R 31/2831; G01R 31/31702
See application file for complete search history.

(56) References Cited

U.S. PATENT DOCUMENTS

2003/0005359 A1* 1/2003 Magliocco ..... G01R 31/318307
714/25
2009/0063085 A1* 3/2009 Conner ............ G01R 31/31924
702/117
(Continued)

FOREIGN PATENT DOCUMENTS

CN 105527527 A 4/2016
CN 105548790 A 5/2016
(Continued)

OTHER PUBLICATIONS

An Office Action in corresponding CN Application No. 201610460752.5, dated May 17, 2019, 9 pages.

*Primary Examiner* — Tung X Nguyen
(74) *Attorney, Agent, or Firm* — Muncy, Geissler, Olds & Lowe, P.C.

(57) ABSTRACT

A test device and a method are provided in the invention. The test device includes a first connection interface, a storage device, a processor and a second connection interface. The first connection interface is coupled to a device under test (DUT) and obtains power information from the DUT according to a first instruction. The storage device stores the power information. The processor is coupled to the first connection interface and storage device, when the first connection interface is coupled to the DUT, sends the first instruction to the first connection interface, receives the power information from the first connection interface, and stores the power information in the storage device. The second connection interface is coupled to an external controlling system, sends the power information to the external controlling system and receives a test instruction from the external controlling system to test the DUT.

13 Claims, 6 Drawing Sheets

(56) References Cited

U.S. PATENT DOCUMENTS

2014/0089554 A1 3/2014 Chen
2016/0187420 A1 6/2016 Trethewey et al.

FOREIGN PATENT DOCUMENTS

CN 105656162 A 6/2016
TW 201132994 A 10/2011
TW 201300798 A 1/2013

* cited by examiner

TEST DEVICE AND METHOD

CROSS REFERENCE TO RELATED APPLICATIONS

This application is a Divisional of application Ser. No. 15/373,796, filed on Dec. 9, 2016, now U.S. Pat. No. 10,656,176 for which priority is claimed under 35 U.S.C. § 120; and this Application claims priority of Taiwan Patent Application No. 105119517, filed on Jun. 22, 2016, the entirety of which is incorporated by reference herein.

BACKGROUND OF THE INVENTION

Field of the Invention

The invention generally relates to testing technology for Universal Serial Bus (USB) Type-C Power-Delivery (PD), and more particularly, to testing technology for automatically testing USB Type-C PD through serial communication by a test device.

Description of the Related Art

As technology advances, the standard of USB is continuously being modified and upgraded. USB 3.0 Promoter Group declared that the development of the USB Type-C connector started in December, 2013, and the new standard was specified in 2014. The Type-C connector was developed based on the technologies of USB 3.0 and USB 2.0. Therefore, for transmission performance, the Type-C connector can support USB 3.1 high-speed transmission (10 Gbit/s) and the size of the Type-C connector is compatible with the connector size specified in the standards of USB 3.0 and USB 2.0. In addition, because both the upper side and the lower side of the USB Type-C connector are configured pins, the Type-C connector (interface) can support reversible plug orientation. Namely, the user can use the Type-C connector without regard to plug orientation.

Further, the USB type-C connector can be utilized with the USB-PD technology. USB-PD technology is a power transmission (charge/discharge) standard specified by the USB Implementers Forum (USB-IF). It is defined in the USB-PD standard that the structure of USB-PD comprises a Source and a Sink. Different profiles are specified in the USB-PD standard to provide different voltages and currents to meet the requirements of different electronic devices.

Figure 1:
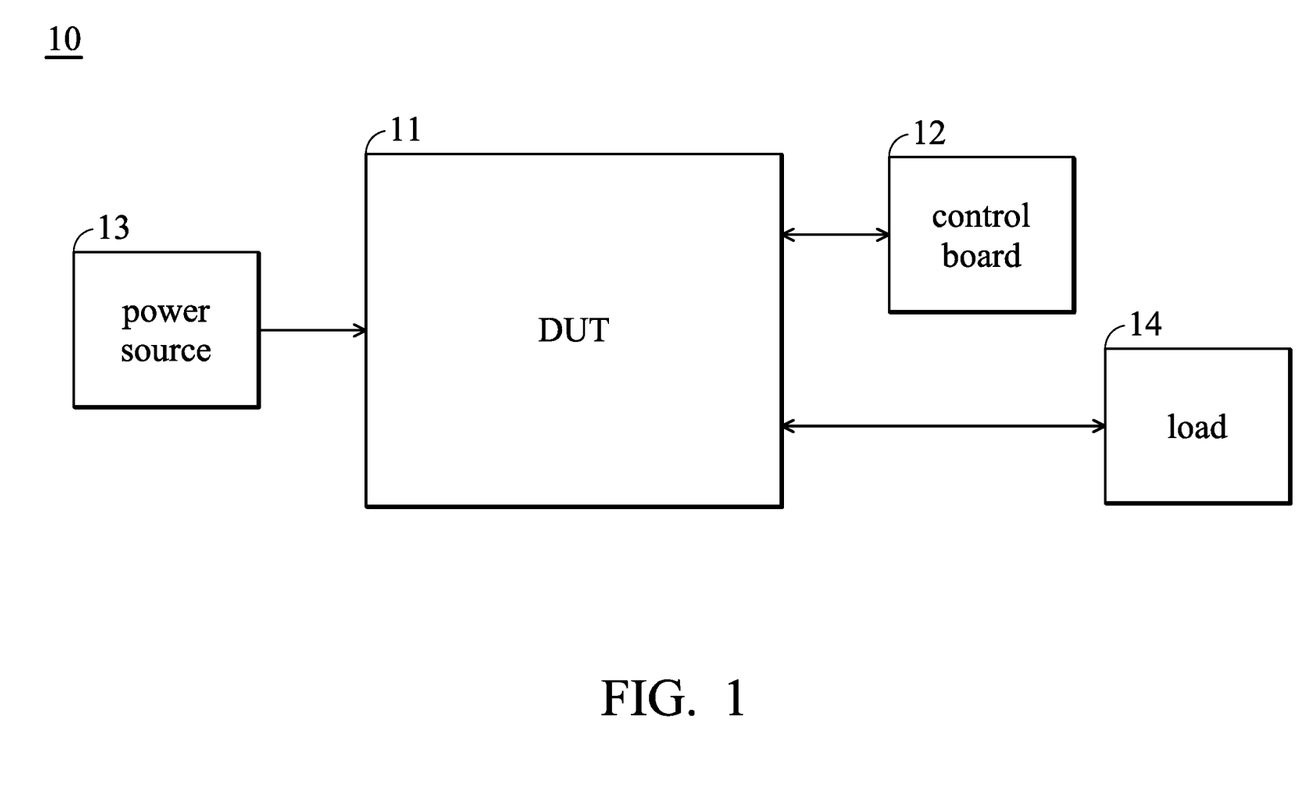
FIG. 1 is a block diagram of a test system 10 according to the prior art of the invention.

FIG. 1 is a block diagram of a test system 10 according to the prior art of the invention. As shown in FIG. 1, when a device under test (DUT) 11 is tested, the DUT 11 may be connected to a control board 12, a power source 13, and a load 14. However, in current test of the USB Type-C PD device (i.e. DUT 11), the user needs to operate the control board 12 manually to switch different test settings (i.e. different groups of voltages and currents that the DUT 11 can provide to the load 14) to test the different groups of voltages and currents which the USB Type-C PD device supports. Therefore, how to test the USB Type-C PD device automatically and efficiently is an important subject.

BRIEF SUMMARY OF THE INVENTION

A test device and method for automatically testing USB Type-C PD through serial communication are provided to overcome the problems mentioned above.

An embodiment of the invention provides a test device. The test device comprises a first connection interface, a storage device, a processor and a second connection interface. The first connection interface is coupled to a device under test (DUT) and obtains power information from the DUT according to a first instruction. The storage device stores the power information. The processor is coupled to the first connection interface and storage device, and when the first connection interface is coupled to the DUT, it sends the first instruction to the first connection interface. In addition, the processor receives the power information from the first connection interface and stores the power information in the storage device. The second connection interface, which is coupled to an external controlling system, sends the power information to the external controlling system and receives a test instruction from the external controlling system to test the DUT.

In some embodiments of the invention, the test device further comprises a first controller and a second controller. The first controller is coupled to the first connection interface and the processor, and converts a first communication format which is applicable to the first connection interface to a second communication format which is applicable to the processor. The second controller is coupled to the second connection interface and the processor, and converts the second communication format which is applicable to the processor to a third communication format which is applicable to the second connection interface. In some embodiments of the invention, the test device only comprises a first controller, and the processor converts the second communication format which is applicable to the processor to a third communication format which is applicable to the second connection interface.

In some embodiments of the invention, the processor sends a power request to the DUT through the first connection interface according to the test instruction to inform the DUT that the DUT needs to provide power corresponding to the power request. In some embodiments of the invention, when the external controlling system sends a serial instruction to request the power information of the DUT, the test device sends the power information to the external controlling system through the second connection interface and the external controlling system sends the test instruction to the second connection interface according to the power information. In some embodiments of the invention, the storage device stores a look-up table and the power information stored in the look-up table.

An embodiment of the invention provides a test device. The test device comprises a first connection interface, a processor and a second connection interface. The first connection interface is coupled to a device under test (DUT) and obtains power information from the DUT according to a first instruction. The processor is coupled to the first connection interface and comprises a storage device. The processor sends the first instruction to the first connection interface when the first connection interface is coupled to the DUT, receives the power information from the first connection interface, and stores the power information in the storage device. The second connection interface is coupled to an external controlling system sends the power information to the external controlling system and receives a test instruction from the external controlling system to test the DUT.

An embodiment of the invention provides test method which is applied in a test device. The test method comprises the steps of sending a first instruction to the DUT through the first connection interface to obtain power information from the DUT when a first connection interface of the test device is coupled to a device under test (DUT); storing the power information in a storage device, wherein the storage device is externally connected to a processor of the test device; sending the power information to the external controlling system through a second connection interface of the test device when an external controlling system sends a serial instruction to request the power information of the DUT; receiving a test instruction from the external controlling system through the second connection interface to test the DUT.

An embodiment of the invention provides a test method which is applied in a test device. The test method comprises the steps of sending a first instruction to the DUT through the first connection interface to obtain power information from the DUT when a first connection interface of the test device is coupled to a device under test (DUT); storing the power information in a storage device, wherein the storage device is comprised in a processor of the test device; sending the power information to the external controlling system through a second connection interface of the test device when an external controlling system sends a serial instruction to request the power information of the DUT; and receiving a test instruction from the external controlling system through the second connection interface to test the DUT.

Other aspects and features of the invention will become apparent to those with ordinary skill in the art upon review of the following descriptions of specific embodiments of test devices and methods.

BRIEF DESCRIPTION OF THE DRAWINGS

The invention will become more fully understood by referring to the following detailed description with reference to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2A:
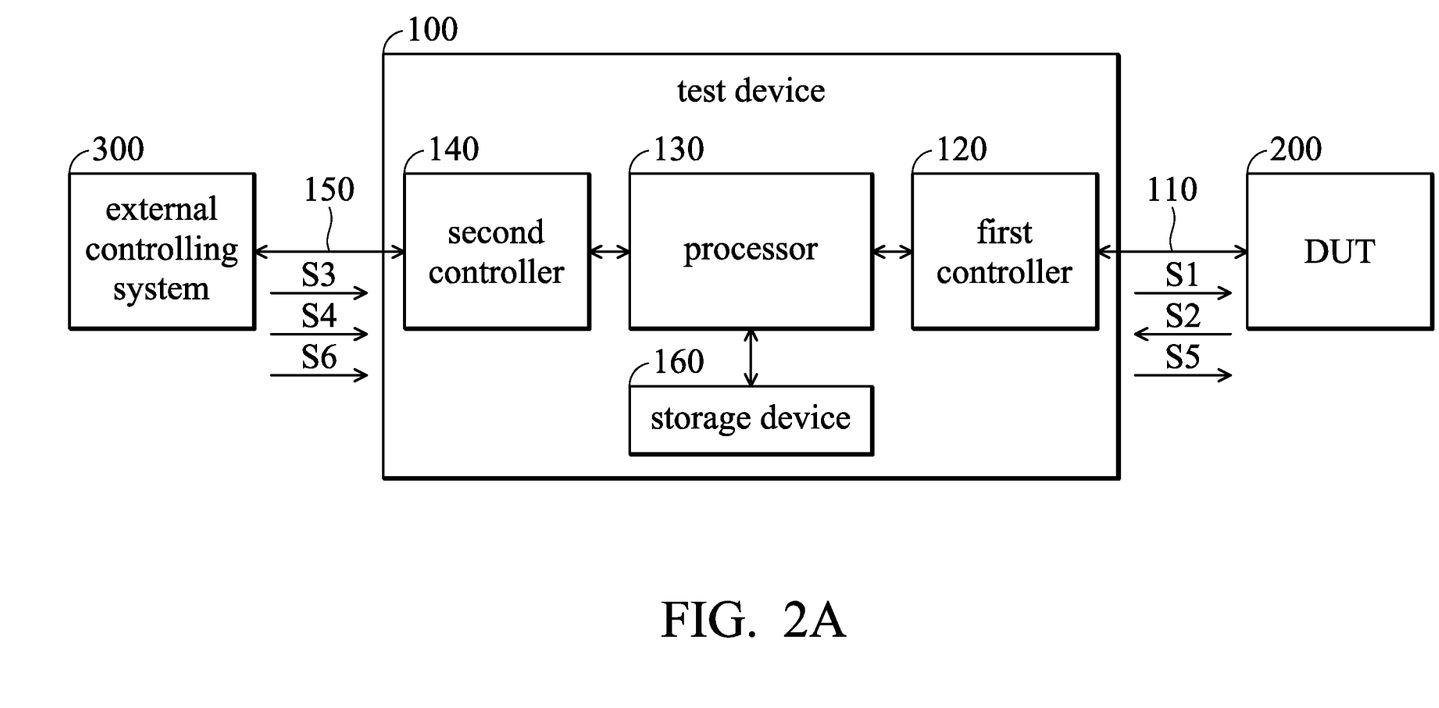
FIG. 2A is a block diagram of a test device 100 according to an embodiment of the invention.

FIG. 2A is a block diagram of a test device 100 according to an embodiment of the invention. As shown in FIG. 2A, the test device 100 comprises a first connection interface 110, a first controller 120, a processor 130, a second controller 140, a second connection interface 150 and a storage device 160. Note that, in order to clarify the concept of the invention, FIG. 2A presents a simplified block diagram in which only the elements relevant to the invention are shown. However, the invention should not be limited to what is shown in FIG. 2A. The test device 100 can also comprise other elements.

In an embodiment of the invention, the test device 100 may be a control board. In embodiment of the invention, a device under test (DUT) 200 may be an electronic device which supports the USB type-C Power Delivery (PD) function. When the DUT 200 is tested, the test device 100 can be regarded as a Sink and the DUT 200 can be regarded as a Source.

In an embodiment of the invention, the first connection interface 110 may be a USB type-C connection interface, and is coupled to a first controller 120. When the DUT 200 is tested, the first connection interface 110 will be coupled to the DUT 200. The test device 100 can communicate with the DUT 200 (e.g. send instructions to DUT 200) and obtain the power information of the DUT 200 from the DUT 200 through a Configuration Channel pin (CC pin) of the USB type-C connection interface (i.e. the first connection interface 110). In an embodiment of the invention, the DUT 200 further comprises a connection interface corresponding to the first connection interface 110. The DUT 200 can be coupled to the first connection interface 110 of the test device 100 through the connection interface for the test.

In an embodiment of the invention, the second connection interface 150 is a serial communication interface, such as a RS-232 interface, a RS-485 interface, and an I2C interface, but the invention should not be limited to these interfaces. The second connection interface 150 is coupled to the second controller 140 and an external controlling system 300. In an embodiment of the invention, the external controlling system 300 may be a computer device and comprise a connection interface corresponding to the second connection interface 150. The external controlling system 300 can be coupled to the second connection interface 150 of the test device 100 through this connection interface. In the embodiments of the invention, the external controlling system 300 may send instructions to the second connection interface 150 to proceed with the test of the DUT 200.

In an embodiment of the invention, the first controller 120 is coupled to the first connection interface 110 and processor 130. The first controller 120 is configured to convert the data or signals communicated between the first connection interface 110 and the processor 130 to the applicable communication format for the first connection interface 110 and the processor 130. That is to say, the first controller 120 may convert a first communication format which is applicable to the first connection interface 110 to a second communication format which is applicable to the processor 130, and convert the second communication format which is applicable to the processor 130 to the first communication format which is applicable to the first connection interface 110.

In an embodiment of the invention, the second controller 140 is coupled to the second connection interface 150 and the processor 130. The second controller 140 is configured to convert the data or signals communicated between the second connection interface 150 and the processor 130 to the applicable communication format for the second connection interface 150 and the processor 130. That is to say, the second controller 140 may convert the second communication format which is applicable to the processor 130 to a third communication format which is applicable to the second connection interface 150, and convert the third communication format which is applicable to the second connection interface 150 to the second communication format which is applicable to the processor 130.

Figure 2B:
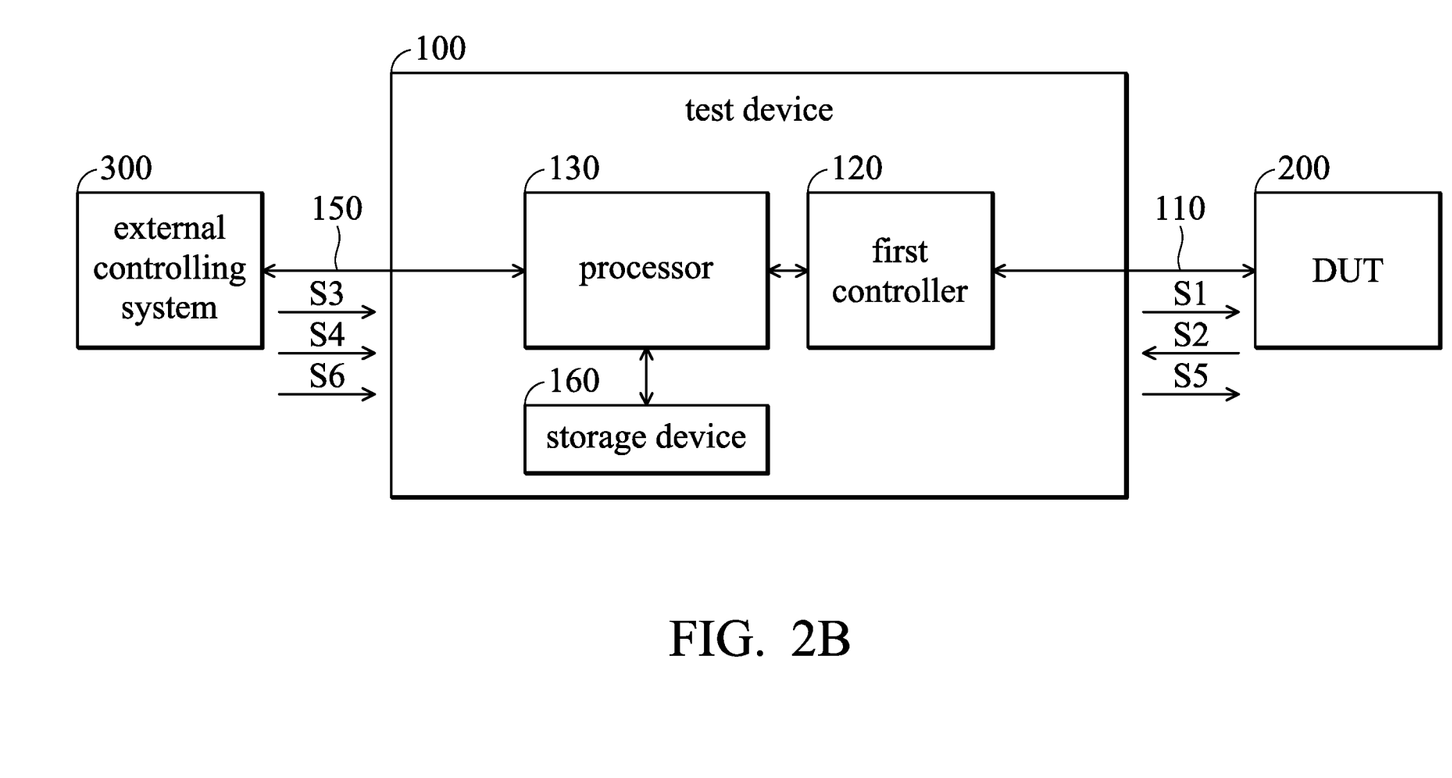
FIG. 2B is a block diagram of a test device 100 according to another embodiment of the invention.
Figure 2C:
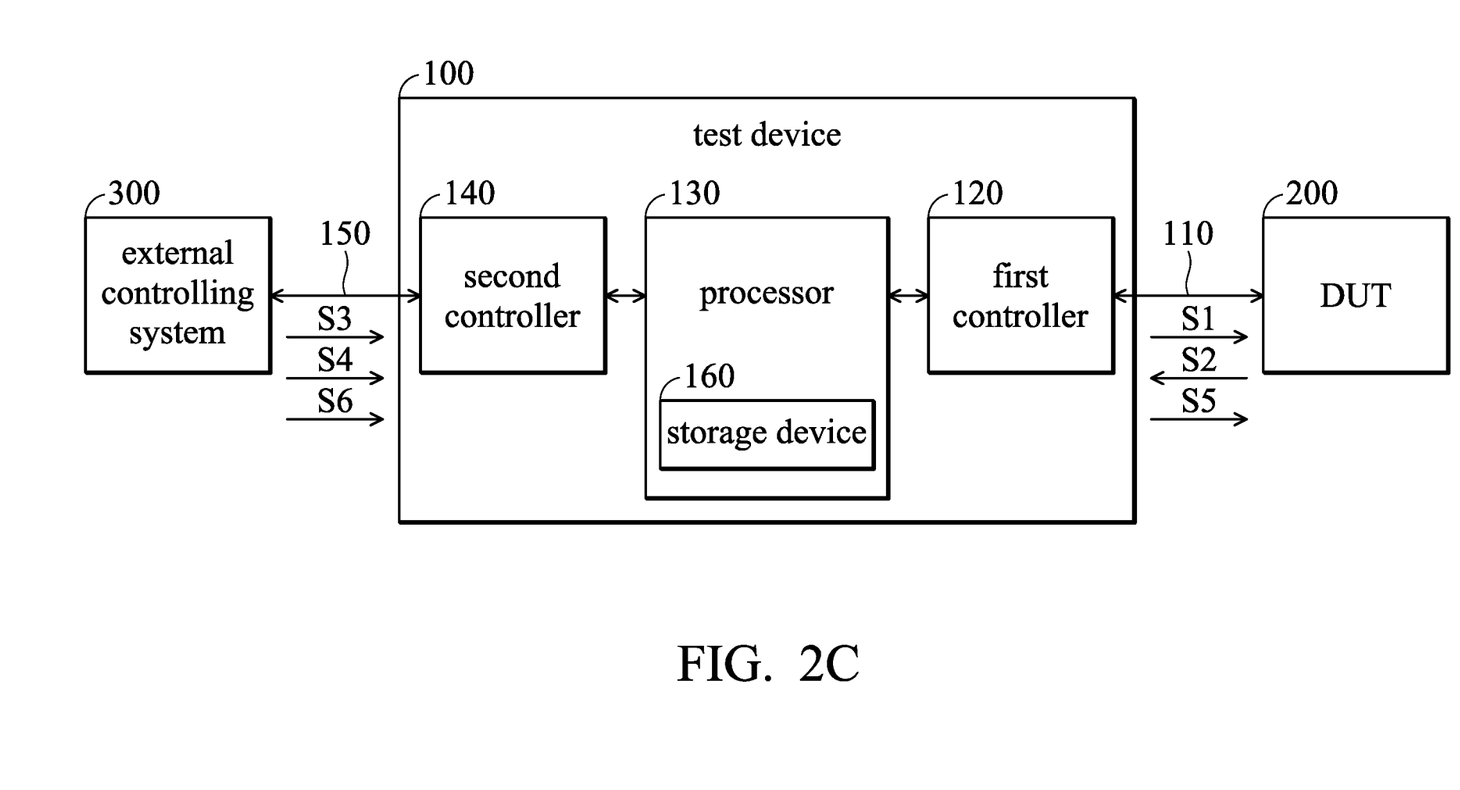
FIG. 2C is a block diagram of a test device 100 according to another embodiment of the invention.
Figure 2D:
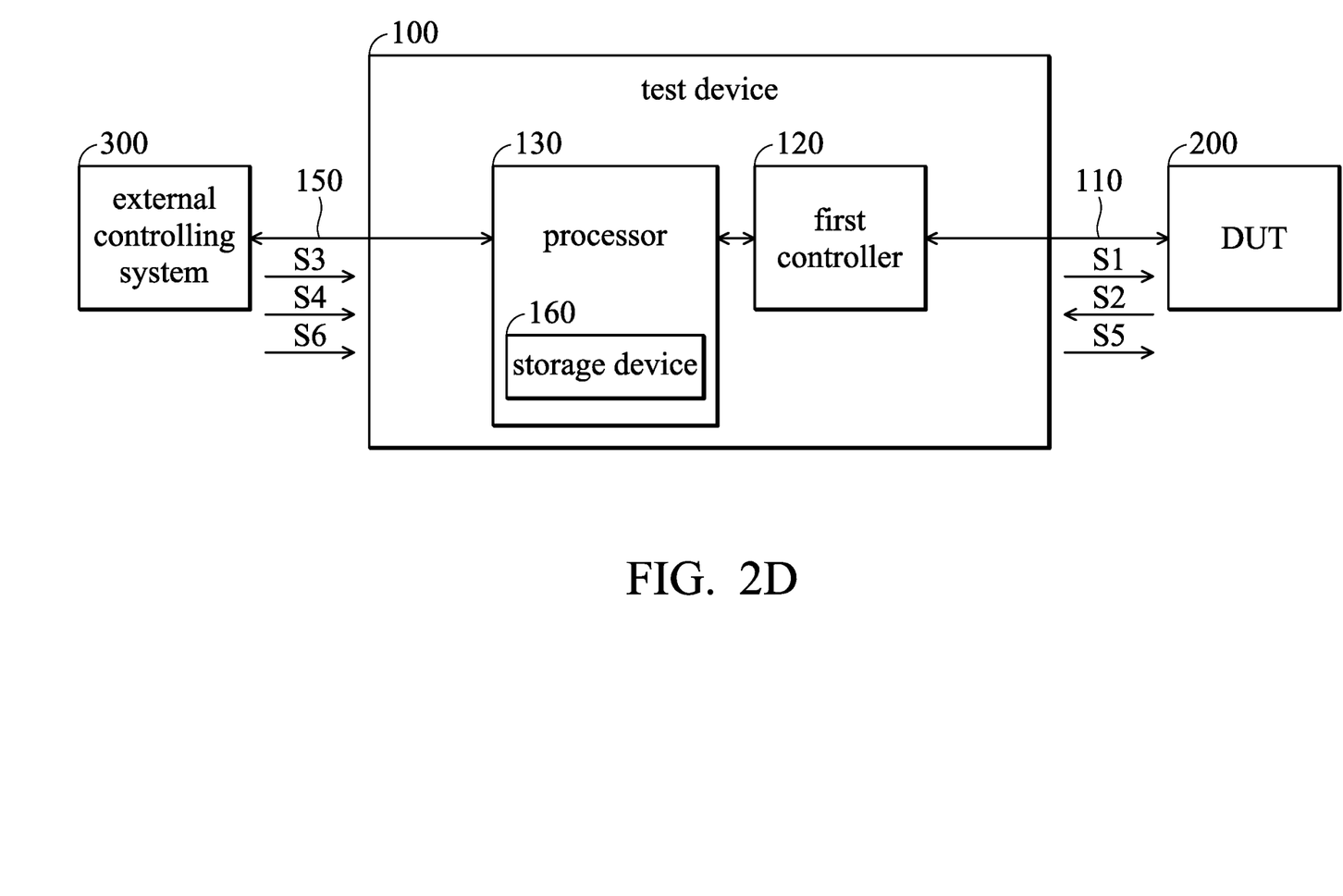
FIG. 2D is a block diagram of a test device 100 according to another embodiment of the invention.

In another embodiment of the invention, as shown in FIGS. 2B and 2D, the test device 100 may not comprise the second controller 140. That is to say, in this embodiment, the processor 130 can comprise the function of the second controller 140. Therefore, the processor 130 may directly convert the data or signals communicated between the second connection interface 150 and the processor 130 to the applicable communication format for the second connection interface 150 and the processor 130. That is to say, the processor 130 may convert the second communication format which is applicable to the processor 130 to the third communication format which is applicable to the second connection interface 150, and convert the third communication format which is applicable to the second connection interface 150 to the second communication format which is applicable to the processor 130.

In an embodiment of the invention, the storage device 160 is coupled to the processor 130. In the embodiments of the invention, the storage device 160 may be configured to store the power information of the DUT 200 in a look-up table (LUT). The storage device 160 may be a volatile memory (e.g. Random Access Memory (RAM)), or a non-volatile memory (e.g. a flash memory, Read Only Memory (ROM)), a hard disc or a combination of the memory devices listed above. In another embodiment of the invention, as shown in FIGS. 2C and 2D, the storage device 160 may be integrated in the processor 130.

In an embodiment of the invention, the processor 130 may be a microcontroller unit (MCU). In an embodiment of the invention, the processor 130, the first controller 120 and the second controller 140 may be integrated in a chip.

In an embodiment of the invention, when the DUT 200 is tested, the first connection interface 110 will be coupled to the DUT 200. When the first connection interface 110 is coupled to the DUT 200, the processor 130 may send a first instruction S1 to the DUT 200 through the first connection interface 110 to obtain power information S2 from the DUT 200. In an embodiment of the invention, the power information S2 may comprise a plurality of groups (e.g. 6 groups, but the invention should not be limited to this) of voltage values and current values which the DUT 200 can provide. After the processor 130 obtains the power information S2 of the DUT 200, the processor 130 may store the power information S2 of the DUT 200 in the look-up table of the storage device 160.

In an embodiment of the invention, when the second connection interface 150 is coupled to the external controlling system 300, and the external controlling system 150 sends a first serial instruction S3 to the test device 100 to ask the test device 100 to provide the power information S2 of DUT 200, according to the first serial instruction S3 received from the second connection interface 150, the processor 130 may provide the power information S2 of the DUT 200 stored in the look-up table of the storage device 160 to the external controlling system 300 through the second connection interface 150.

After the external controlling system 300 obtains the power information S2 of the DUT 200, the external controlling system 300 can know which groups of voltage and current values the DUT 200 can provide. Then, the external controlling system 300 may send a test instruction S4 to the second connection interface 150 to inform the test device 100 which group of voltage and current values of the DUT 200 will have its power delivery tested. When the processor 130 receives the test instruction S4 from the external controlling system 300, the processor 130 may send a power request S5 (Request signal) to the DUT 200 through the first connection interface 110 according to the test instruction S4 to inform the DUT 200 that the DUT 200 needs to provide power (i.e. the group of voltage and current values which the external controlling system 300 wants to test) corresponding to the power request S5. For example, when the external controlling system 300 knows that the DUT 200 can provide 6 groups of voltage and current values according to the power information S2, if the external controlling system 300 desires to test the power delivery for the second group of voltage and current values of the DUT 200, the external controlling system 300 may send the test instruction S4 to the second connection interface 150 to inform the test device 100 that the power delivery for the second group of voltage and current values of the DUT 200 will be tested. When the processor 130 receives the test instruction S4 from the external controlling system 300, the processor 130 may send a power request S5 to the DUT 200 through the first connection interface 110 according to the test instruction S4 to inform the DUT 200 that the DUT 200 needs to provide the second group of voltage and current values.

When the DUT 200 receives the power request S5, if the DUT can provide the power (i.e. the group of voltage and current values which the external controlling system 300 wants to test) corresponding to the power request S5, the DUT 200 may send an Accept signal to the test device 100 to inform the test device 100 that it can provide the power corresponding to the power request S5. When the DUT 200 has prepared the power corresponding to the power request S5 (i.e. the DUT 200 has switched to the group of voltage and current values which needs to be tested), the DUT 200 may send a PS_RDY signal to the test device 100 to inform the test device 100 that it has prepared the power corresponding to the power request S5.

When the test device 100 receives the Accept signal and the PS_RDY signal, the test device 100 may record the Accept signal and the PS_RDY signal in the look-up table. When the external controlling device 300 sends a second serial instruction S6 to inquire of the test device 100 about the preparation state of the group of voltage and current values (i.e. the group of voltage and current values which the external controlling system 300 wants to test), the test device 100 may inform the external controlling system 300 that the DUT 200 has prepared the group of voltage and current values which the external controlling system 300 wants to test, and inform the DUT 200 that the DUT 200 needs to provide the group of voltage and current values which the external controlling system 300 wants to test to the external controlling system 300 to test the power delivery for this group of voltage and current values of the DUT 200.

Figure 3:
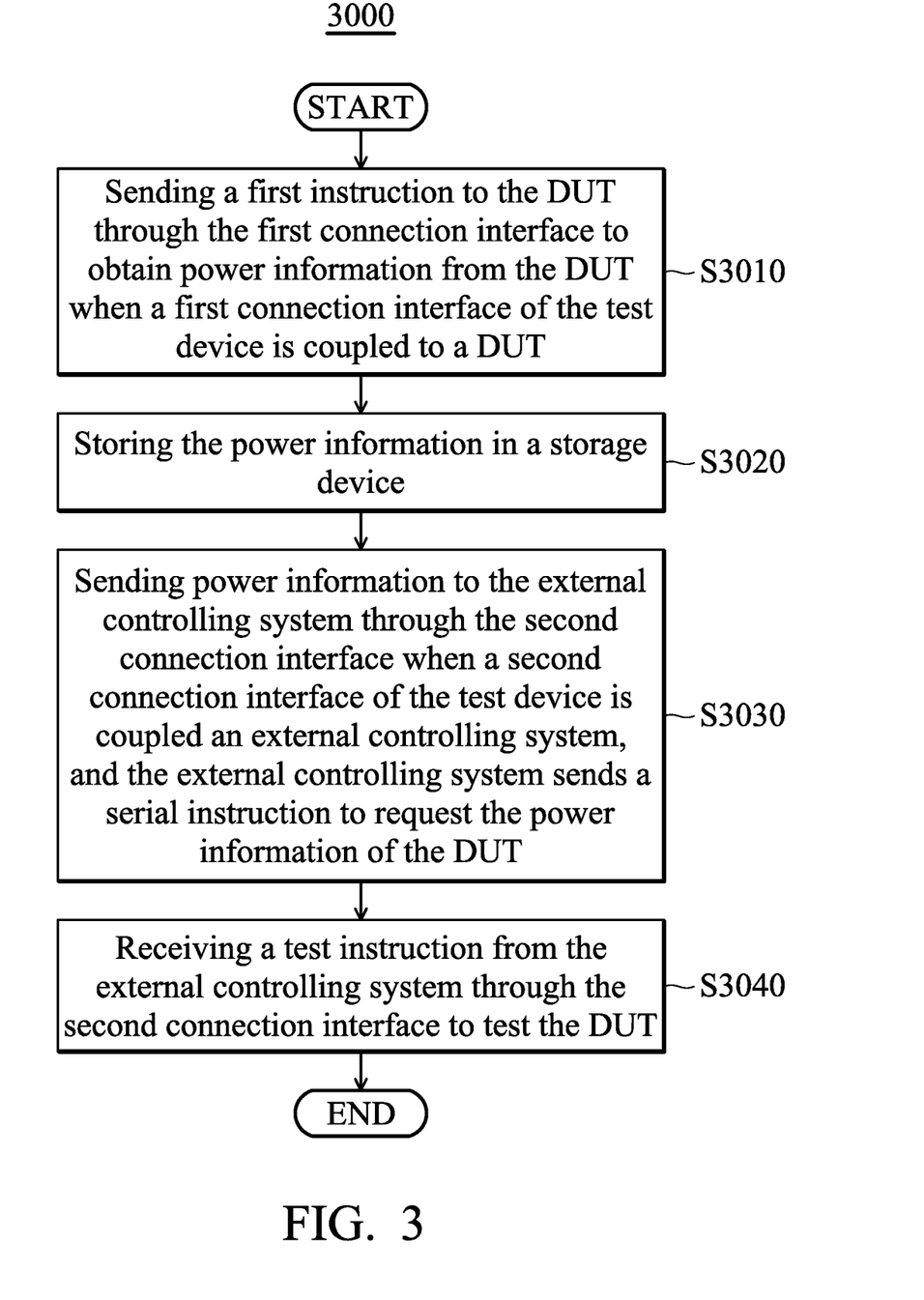
FIG. 3 is a flow chart 300 illustrating the test method according to an embodiment of the invention.

FIG. 3 is a flow chart 3000 illustrating the test method according to an embodiment of the invention. The test method is applied to the test device 100. As shown in FIG. 3, in step S3010, when a first connection interface of the test device is coupled to a DUT, the test device sends a first instruction to the DUT through the first connection interface to obtain power information from the DUT. In step S3020, the power information is stored in a storage device after the test device obtained the power information. In step S3030, when a second connection interface of the test device is coupled an external controlling system, and the external controlling system sends a serial instruction to request the power information of the DUT, the test device sends power information to the external controlling system through the second connection interface. In step S3040, the test device receives a test instruction from the external controlling system through the second connection interface to test the DUT. In an embodiment of the invention, the power information may be stored in a look-up table of the storage device.

In an embodiment of the invention, the storage device is connected to a processor of the test device externally. In another embodiment of the invention, the storage device is comprised in a processor of the test device.

In an embodiment, the test method further comprises the steps of that a first controller converts a first communication format which is applicable to the first connection interface to a second communication format which is applicable to the processor of the test device; and a second controller converts the second communication format which is applicable to the processor to a third communication format which is applicable to the second connection interface. In another embodiment, the test method further comprises the steps of that a first controller converts a first communication format which is applicable to the first connection interface to a second communication format which is applicable to the processor of the test device; and the processor converts the second communication format which is applicable to the processor to a third communication format which is applicable to the second connection interface.

In an embodiment of the invention, the test method further comprises the step of sending test instruction to the second connection interface according to the power information by the external controlling system. In an embodiment of the invention, the test method further comprises the step of sending a power request to the DUT through the first connection interface according to the test instruction by the test device to inform the DUT that the DUT needs to provide power corresponding to the power request.

According to the test method provided by the embodiments of the invention, different groups of voltage and current values which are supported by the test device can be tested by a test device through serial communication to achieve the automatic testing of the USB Type-C PD.

The steps of the method described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such that the processor can read information (e.g., code) from and write information to the storage medium. A sample storage medium may be integral to the processor. The processor and the storage medium may reside in an ASIC. The ASIC may reside in user equipment. In the alternative, the processor and the storage medium may reside as discrete components in user equipment. Moreover, in some aspects, any suitable computer-program product may comprise a computer-readable medium comprising codes relating to one or more of the aspects of the disclosure. In some aspects, a computer software product may comprise packaging materials.

It should be noted that although not explicitly specified, one or more steps of the methods described herein can include a step for storing, displaying and/or outputting as required for a particular application. In other words, any data, records, fields, and/or intermediate results discussed in the methods can be stored, displayed, and/or output to another device as required for a particular application. While the foregoing is directed to embodiments of the present invention, other and further embodiments of the invention can be devised without departing from the basic scope thereof. Various embodiments presented herein, or portions thereof, can be combined to create further embodiments. The above description is of the best-contemplated mode of carrying out the invention. This description is made for the purpose of illustrating the general principles of the invention and should not be taken in a limiting sense. The scope of the invention is best determined by reference to the appended claims.

The above paragraphs describe many aspects. Obviously, the teaching of the invention can be accomplished by many methods, and any specific configurations or functions in the disclosed embodiments only present a representative condition. Those who are skilled in this technology will understand that all of the disclosed aspects in the invention can be applied independently or be incorporated.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A test device, comprising:
   a first connection interface, coupled to a device under test (DUT) and obtaining power information from the DUT according to a first instruction;
   a storage device, storing the power information;
   a processor, coupled to the first connection interface and the storage device, when the first connection interface is coupled to the DUT, sending the first instruction to the first connection interface, receiving the power information from the first connection interface, and storing the power information in the storage device;
   a second connection interface, coupled to an external controlling system, sending the power information to the external controlling system and receiving a test instruction from the external controlling system to test the DUT; and
   a first controller, coupled to the first connection interface and the processor, and converting a first communication format which is applicable to the first connection interface to a second communication format which is applicable to the processor.

2. The test device of claim 1, wherein the processor converts the second communication format which is applicable to the processor to a third communication format which is applicable to the second connection interface.

3. The test device of claim 1, wherein the first connection interface is a USB Type-C connection interface, and the second connection interface is a serial communication interface.

4. The test device of claim 3, wherein the first connection interface obtains the power information of the DUT through a configuration channel (CC) pin of the USB Type-C connection interface.

5. The test device of claim 1, wherein the processor sends a power request to the DUT through the first connection interface according to the test instruction to inform the DUT that the DUT needs to provide power corresponding to the power request.

6. The test device of claim 5, wherein when the external controlling system sends a serial instruction to request the power information of the DUT, the test device sends the power information to the external controlling system through the second connection interface and the external controlling system sends the test instruction to the second connection interface according to the power information.

7. The test device of claim 1, wherein the storage device stores a look-up table, and the power information stored in the look-up table.

8. A test method, applied in a test device, comprising:
when a first connection interface of a test device is coupled to a device under test (DUT), sending a first instruction to the DUT through the first connection interface to obtain power information from the DUT;
storing the power information in a storage device of the test device, wherein the storage device is externally connected to a processor of the test device;
when an external controlling system sends a serial instruction to request the power information of the DUT, sending the power information to the external controlling system through a second connection interface of the test device; and
receiving a test instruction from the external controlling system through the second connection interface to test the DUT,
wherein the test method further comprising:
converting, by a first controller of the test device, a first communication format which is applicable to the first connection interface to a second communication format which is applicable to the processor; and
converting, by the processor of the test device, the second communication format which is applicable to the processor to a third communication format which is applicable to the second connection interface.

9. The test method of claim 8, wherein the first connection interface is a USB Type-C connection interface, and the second connection interface is a serial communication interface.

10. The test method of claim 9, further comprising:
obtaining the power information of the DUT through a configuration channel (CC) pin of the USB Type-C connection interface.

11. The test method of claim 8, further comprising:
sending a power request to the DUT through the first connection interface according to the test instruction to inform the DUT that the DUT needs to provide power corresponding to the power request.

12. The test method of claim 11, further comprising:
sending, by the external controlling system, the test instruction to the second connection interface according to the power information.

13. The test method of claim 8, further comprising:
storing the power information in a look-up table of the storage device.

* * * * *